United States Patent [19]
Koszarsky

[11] Patent Number: 6,084,448
[45] Date of Patent: Jul. 4, 2000

[54] ADAPTIVE DIVIDER CONTROL FOR A PHASE LOCK LOOP CIRCUIT

[75] Inventor: Christopher Koszarsky, Holly Springs, N.C.

[73] Assignee: Ericsson Inc., Research Triangle Park, N.C.

[21] Appl. No.: 09/099,226

[22] Filed: Jun. 17, 1998

[51] Int. Cl.[7] ....................................................... H03L 7/08
[52] U.S. Cl. ........................ 327/156; 327/115; 327/117; 327/147
[58] Field of Search ...................................... 327/105, 107, 327/147, 150, 156, 159, 115, 117; 377/47

[56] References Cited

U.S. PATENT DOCUMENTS

| | | |
|---|---|---|
| 5,038,117 | 8/1991 | Miller ........................................ 331/16 |
| 5,140,284 | 8/1992 | Petersson et al. ......................... 331/25 |
| 5,351,014 | 9/1994 | Ichiyoshi .................................. 331/1 A |
| 5,861,766 | 1/1999 | Baumer et al. ........................... 327/105 |

*Primary Examiner*—Tuan T. Lam
*Attorney, Agent, or Firm*—Wood, Phillips, VanSanten, Clark & Mortimer

[57] ABSTRACT

A phase lock loop circuit comprising a reference frequency divider, wherein the divisor increases until the desired operating frequency is reached. The input frequency is delivered to a summing circuit that sums the input frequency with an output frequency. The resultant frequency is delivered to a phase comparator, which generates an error voltage. The error voltage is used to drive a voltage-controlled oscillator to generate an output frequency. A divisor in the voltage-controlled oscillator increases synchronously with the reference frequency divider until the desired operating frequency is reached.

17 Claims, 5 Drawing Sheets

ADAPTIVE DIVIDER CONTROL FOR A PHASE LOCK LOOP CIRCUIT

FIELD OF THE INVENTION

This invention relates to the field of phase lock loop circuits, and, more specifically, to a phase lock loop circuit that employs an adaptive divider control to achieve faster transient performance.

BACKGROUND OF THE INVENTION

It is a given that transient performance of phase lock loop circuits should be minimized in order to optimize the performance of the total circuit. In mobile telephones, however, minimizing transient time is critical to functionality. Mobile telephones operate on many frequencies and change frequencies often. Mobile telephones, however, have only one frequency synthesizer in order to keep weight, size and part costs down. Consequently, frequency synthesizers in these applications must settle into the frequency as rapidly as possible. Such frequency synthesizers use phase lock loop circuits to achieve this goal. Any improvement in transient time in the phase lock loop circuit translates into overall improvement of the operation of the frequency synthesizer, and hence improves the operation of a mobile telephone as a whole.

SUMMARY OF THE INVENTION

This invention comprises an adaptive divider control for a phase locked loop circuit that settles its output frequency more rapidly than prior systems. By adaptively varying the divisors selected for a predefined frequency until the frequency settles, the frequency settles faster. To this end, a phase lock loop according to my invention comprises a reference frequency divider, wherein the divisor varies during the transient time. Advantageously, the divisor increases until the desired operating frequency is reached. The resulting input frequency is delivered to a summing circuit that sums the input frequency with an output frequency. The resultant frequency is delivered to a phase comparator, which generates a control (also called "error") voltage proportional to the phase difference. The control voltage drives a voltage-controlled oscillator to generate an output frequency. A divisor in the synthesizer ASIC synchronously varies with the divider divisor. Again, the divisor advantageously increases until the desired operating frequency is reached. By varying these two divisors, the bandwidth of the loop is increased during the transient time, thus allowing the loop to lock more quickly than the prior art.

BRIEF DESCRIPTION OF THE DRAWINGS

A more complete understanding of this invention may be obtained by a consideration of the following description in conjunction with the drawings, in which.

DETAILED DESCRIPTION

Figure 1:
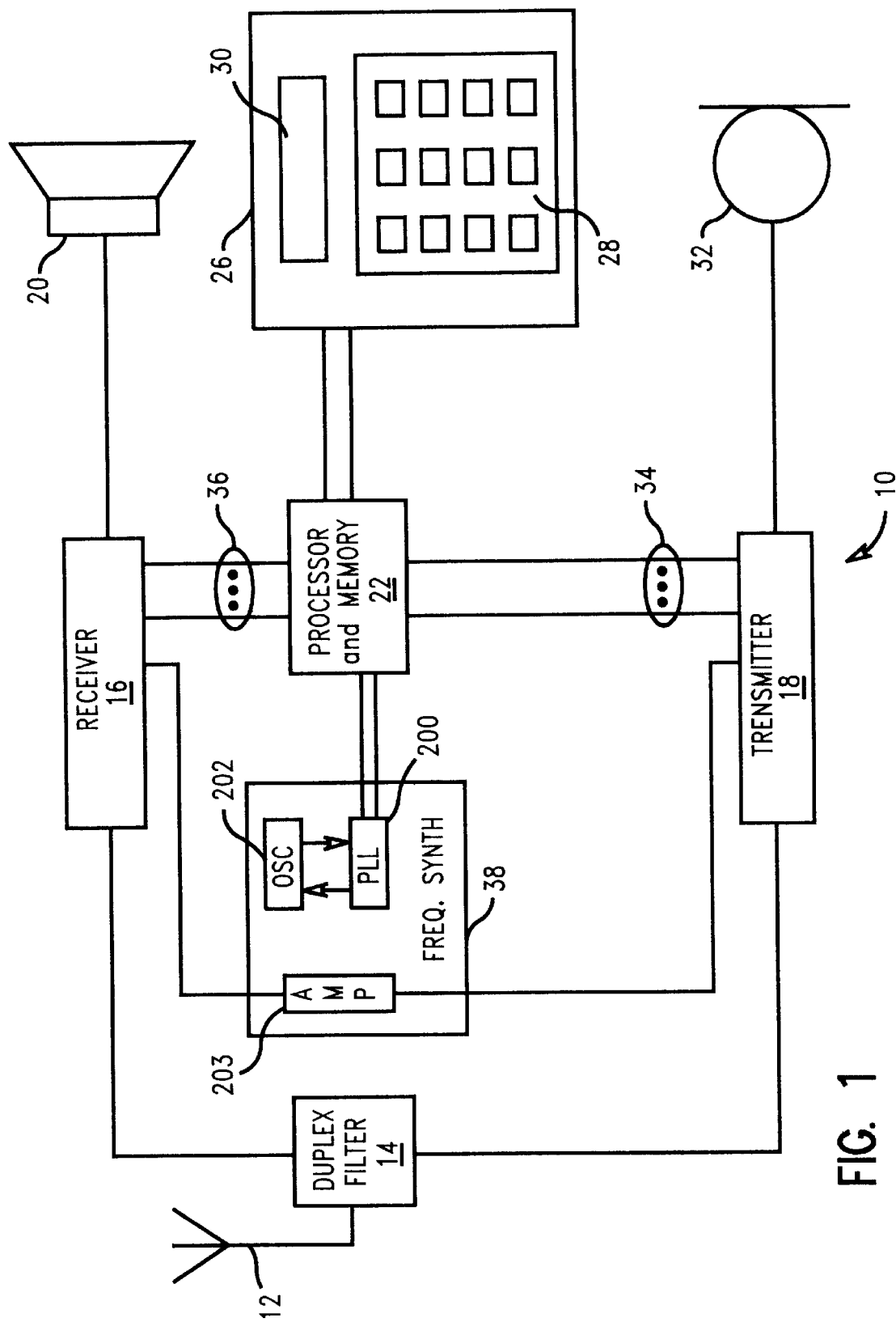
FIG. 1 is a block diagram of a phase lock loop circuit according to an exemplary embodiment of this invention in the context of a wireless telephone.

FIG. 1 illustrates an application of the PLL circuit according to an exemplary embodiment of this invention. FIG. 1 is a block diagram of a wireless telephone (also called a mobile station, cell phone, etc.). Wireless telephone 10 includes an antenna 12 for sending and receiving radio signals between itself and a wireless network. Antenna 12 is connected to duplex filter 14, which enables receiver 16 and transmitter 18 to receive and broadcast (respectively) on the same antenna 12. Receiver 16 demodulates, demultiplexes and decodes the radio signals into one or more channels. Such channels include a control channel and a traffic channel for speech. The speech or data are delivered to speaker 20, or other output device (such as a fax or modem connector).

Receiver 16 delivers messages from the control channel to processor 22. Processor 22 controls and coordinates the functioning of wireless telephone 10 responsive to the control messages using programs and data stored in memory 24, so that wireless telephone 10 can operate within the wireless network. Processor 22 also controls the operation of wireless telephone 10 responsive to input from user interface 26. User interface 26 includes a keypad 28 as a user-input device and a display 30 to give the user information. Other devices are frequently included in user interface 26, such as lights and special purpose buttons. Processor 22 controls the operations of transmitter 18 and receiver 16 over control lines 34 and 36, respectively, responsive to control messages and user input.

Microphone 32 receives speech signal input, converts the input into analog electrical signals and delivers the analog electrical signals to transmitter 18. Transmitter 18 converts the analog electrical signals into digital data, encodes the data with error detection and correction information and multiplexes this data with control messages from processor 22. Transmitter 18 modulates this combined data stream and broadcasts the resultant radio signals to the wireless network through duplex filter 14 and antenna 12.

Processor 22 also control frequency synthesizer 38. In frequency synthesizer 38, a phase lock loop (PLL) 200 receives a reference frequency from oscillator 202 and generates one of the predefined operating frequencies of the wireless network in which wireless telephone is operating. To this end, processor 22 loads PLL 200 with predefined divisors, which are used by PLL 200 to modify the reference frequency of oscillator 202 to a desired frequency. The resulting frequency is delivered to and amplifier, filter, etc. 203. The resultant frequency is delivered to either or both receiver 16 and transmitter 18.

Figure 2:
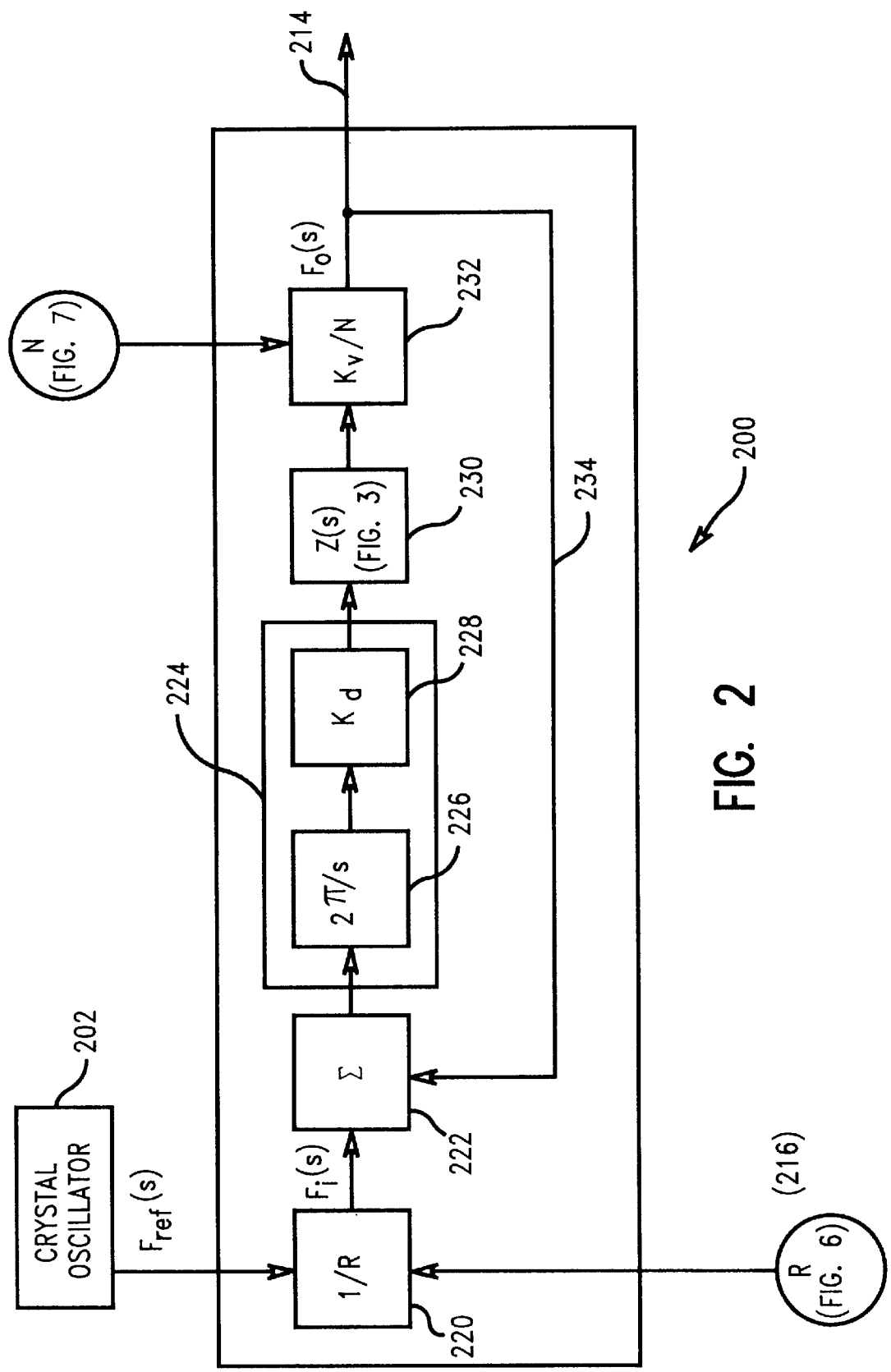
FIG. 2 is a block diagram of a phase lock loop circuit according to an exemplary embodiment of this invention.

FIG. 2 illustrates a block diagram of a phase lock loop circuit, shown generally at 200, according to my invention. Phase lock loop (PLL) 200 generally comprises a unity gain, negative feedback circuit. PLL 200 receives a reference frequency $F_{ref}(s)$ from crystal oscillator 202. In wireless telephone applications, crystal oscillator 202 is highly stable and temperature compensated. The output 214 of PLL 200 comprises the desired comparison frequency, $F_o(s)$, after the settling period. The frequency of $F_o(s)$ depends on the input divisors. As will be discussed further, below, these divisor values control the divisor of the input frequency and the output frequency, respectively. In the wireless telephone application of FIG. 1, processor 22 loads divisor values according to the current state of the wireless telephone, as is known in the art.

PLL 200 includes a divider 220, which receives the R value input 216 and divides the reference frequency by R. In the prior art, R is a fixed, dimensionless variable selected according to the desired output frequency. In this exemplary embodiment, R varies over time, as will be described further, below. The output of divider 220, $F_i(s)$, is an input to summer 222. Summer 222 receives $F_i(s)$ and $F_o(s)$ and derives a composite frequency.

The composite frequency is fed into a comparator 224. Comparator 224 determines the phase difference of the composite frequency, and derives an error voltage or current related to the phase difference between $F_i(s)$ and $F_o(s)$. In this exemplary embodiment, comparator 224 comprises a differential circuit 226 to determine the phase difference in the composite frequency and an amplification circuit 228 that delivers an error current related to the phase difference determined in differential circuit 226.

The error current is fed into a low-pass filter 230 to remove the high frequency components of the error current. In this exemplary embodiment, Z(s) is illustrated in discrete component form in FIG. 3. Z(s) is a two pole, one zero loop filter that follows the form $$Z(s)=Z_o(s+z)/s(s+p_1)$$

Figure 3:
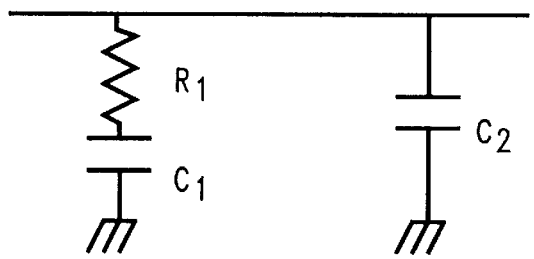
FIG. 3 is a discrete component circuit diagram of the low pass filter of FIG. 2.

In the passive component form of FIG. 3

$$z=1/R_1C_1;$$

$$Z_o=1/C_2$$

and $$p_i=(C_1+C_2)/R_1C_1C_2$$

Returning to FIG. 2, the filtered error current pulses are fed into a voltage-controlled oscillator (VCO) 232. VCO 232 generates a frequency that is dependent on the input (error) voltage. This frequency is divided by a dimensionless divisor, N, which is set by processor 22 for the desired frequency. The output of VCO 232 is $F_o(s)$. $F_o(s)$ is delivered on output 214 to an amplifier/filter 203 as is known in the art, and to summer 222 via feedback loop 234. In this exemplary embodiment, the output of PLL 200, $F_o(s)$, tracks the input of the system, $F_i(s)$, and is governed by the expression $$F_i(s)=F_{ref}(s)/R$$

This produces a final steady state VCO output frequency of $F_{vcoss}$, wherein $$F_{vcoss}=N\,F_{ref}/R$$

An example from the prior art, wherein the values of N and R are constant is given in Table 1.

TABLE 1

| Parameter | Value | Units |
|---|---|---|
| R | 81 | dimensionless |
| N | 4000 | dimensionless |
| $K_d$ | 300e-6 | A/rad |
| $K_v$ | 10e6 | Hz/V |
| $C_1$ | 39 | nF |
| $C_2$ | 39 | nF |
| $R_1$ | 10 | kΩ |

Figure 4:
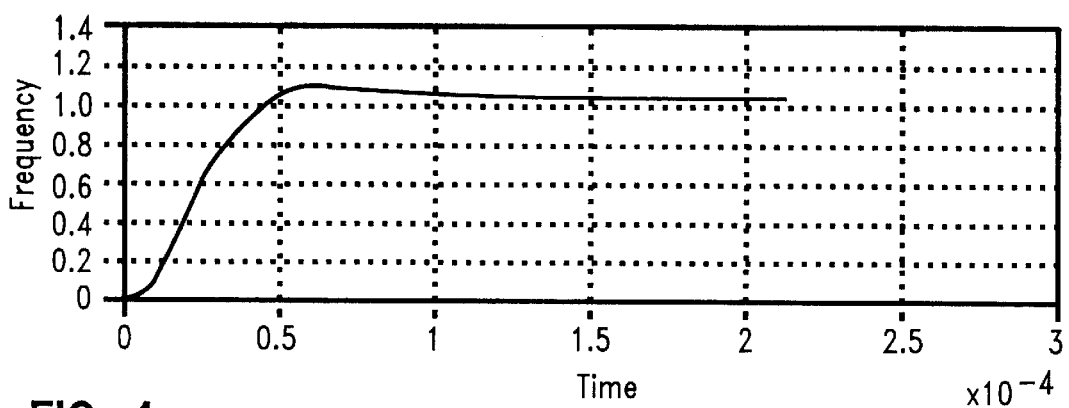
FIG. 4 is a graph of a prior art phase lock loop circuit, plotting response time and bandwidth.

Using these values, the transient response due to a step input function is as shown in FIG. 4. In FIG. 4, the output frequency settles to a final value in approximately 150 ps with a closed loop bandwidth of 10 kHz.

In the prior art, the values of N and R (both constants) are loaded into the PLL directly by processor 22 according to the desired output frequency. I have determined that varying the values of N and R achieves a faster transient response time without affecting the final steady state closed loop response. My invention is based upon two dependent rules of PLL design: 1. the greater the loop bandwidth, the faster the transition time, and, 2. the higher the sample frequency, the faster the transition time. Therefore, to improve the transient response of the output frequency $f_o(t)$, the values of R and N are adaptively varied during the transition time to optimize the transient response according to the above rules.

According to this exemplary embodiment, rather than keeping the values of R and N constant at all times, each sequentially changes during the transition time. For a prior art PLL where R and N do not change $$R(t)=R$$

and $$N(t)=N$$

For the adaptive design of this exemplary embodiment, $$R(t)=R+r(m) \text{ for } m=(1 \ldots k) \text{ and } R(t)=R \text{ for } m>k$$

and $$N(t)=N+s(n) \text{ for } n=(1 \ldots j) \text{ and } N(t)=N \text{ for } n>j$$

According to the above definitions, the steady state values (that is, when the PLL is "locked") of R and N are constant as in the prior art. The above definitions, however, imply different loop bandwidths for the value of R and N for sequential states m<k and n<j.

The values of the adaptive sequences, r(m) and s(n) are chosen to follow three guidelines that improve transient response: (1) increase the sample frequency, (2) increase the loop gain and (3) choose r(m) and s(n) such that N $F_{ref}$/R is as close as possible to $F_{vcoss}$. Guidelines (1) and (2) require that r(m) and s(n) are both negative numbers. Guideline (3) requires that the ratio between r(m) and s(n) should stay relatively constant.

To illustrate the transient response improvement achieved by using the adaptive sequences, consider the numerical example from above and let $$r(m)=[-64, -48, -32,-16] \text{ for } m=\{1 \text{ to } 4\} \text{ and } r(m)=0 \text{ for } m>4$$

and $$s(n)=[-3136, -2352,-1568,-784] \text{ for } n=\{1 \text{ to } 4\} \text{ and } s(n)=0 \text{ for } n>4$$

The time periods for m and n are determined as follows. In digital synthesizers, each time a counter reaches a zero value, a signal reset pulse occurs and the counting process is reinitiated from the beginning. Usually, the divider contents can only be changed during a reset. In general, the difference in time between reset pulses, $t_r$, for the reference counter is given by $$t_r=F_{ref}/R$$

Thus, according to this exemplary embodiment, the time the reference counter operates using a given R value in the sequence is chosen based on the number of reset pulses.

$$m=at_r$$

wherein a is an integer and $t_r$ is the time between reset pulses. Thus, in the numerical example from Table 1, if a=20 the R counter counts at R=81−64=17 for 20 times and then count at R=81−48=33 for 20 times, etc., until a steady state value of R=81 is reached.

The main counter (controlling the divisor of the VCO frequency) operates in exactly the same manner. Its reset signal pulse occurs at the intervals defined by $$n = at_m$$

where $t_m$ follows the relationship $$t_m = F_{vco}/N$$

Note that a is the same for both the main and the reference counters. This is needed so that the adaptive sequences change to their next respective value relatively closely in time. For optimal performance, the integer a should be determined experimentally, according to the application.

Figure 5:
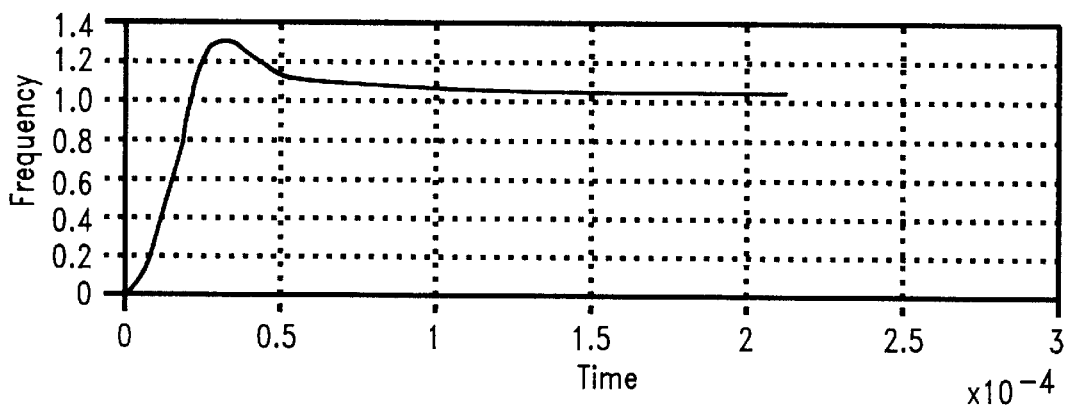
FIG. 5 is a graph of a phase lock loop circuit according to this invention, plotting response time and bandwidth.

A plot of the transient response using the same values as in Table 1 but varying N and R according to this exemplary embodiment is shown in FIG. 5. In this graph, the output waveform settles to a final value in less than 100 μs with an average closed loop bandwidth of approximately 13 kHz.

Figure 6:
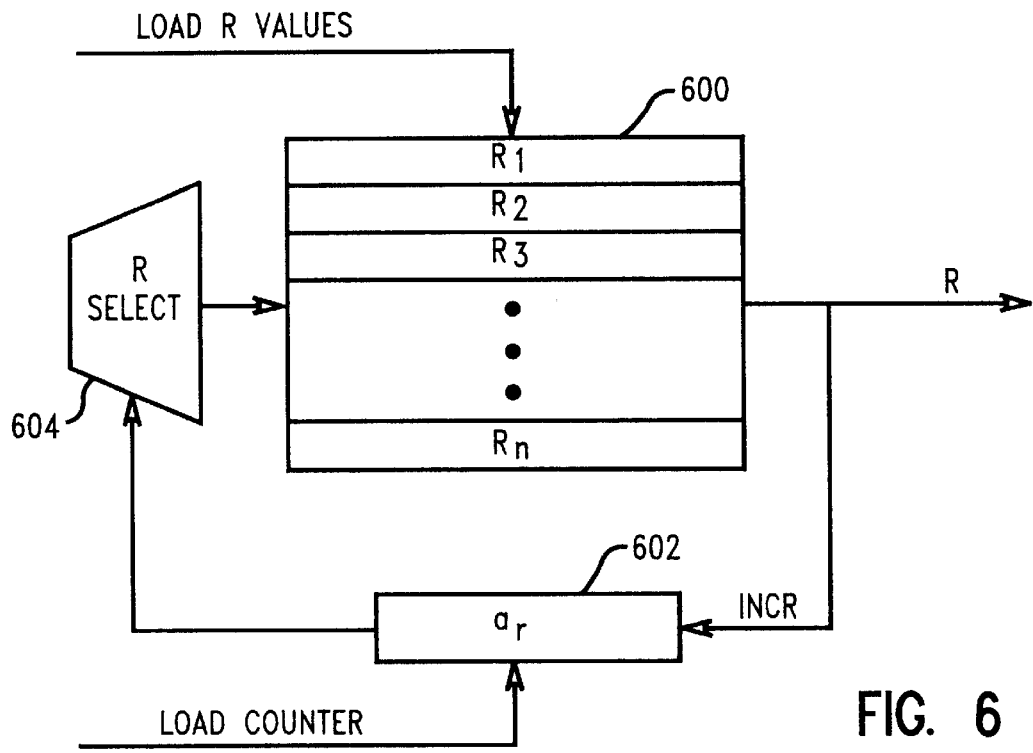
FIG. 6 is a block diagram of an exemplary hardware implementation of the adaptive divisor circuit for the divider of FIG. 2, according to an exemplary embodiment of this invention.
Figure 7:
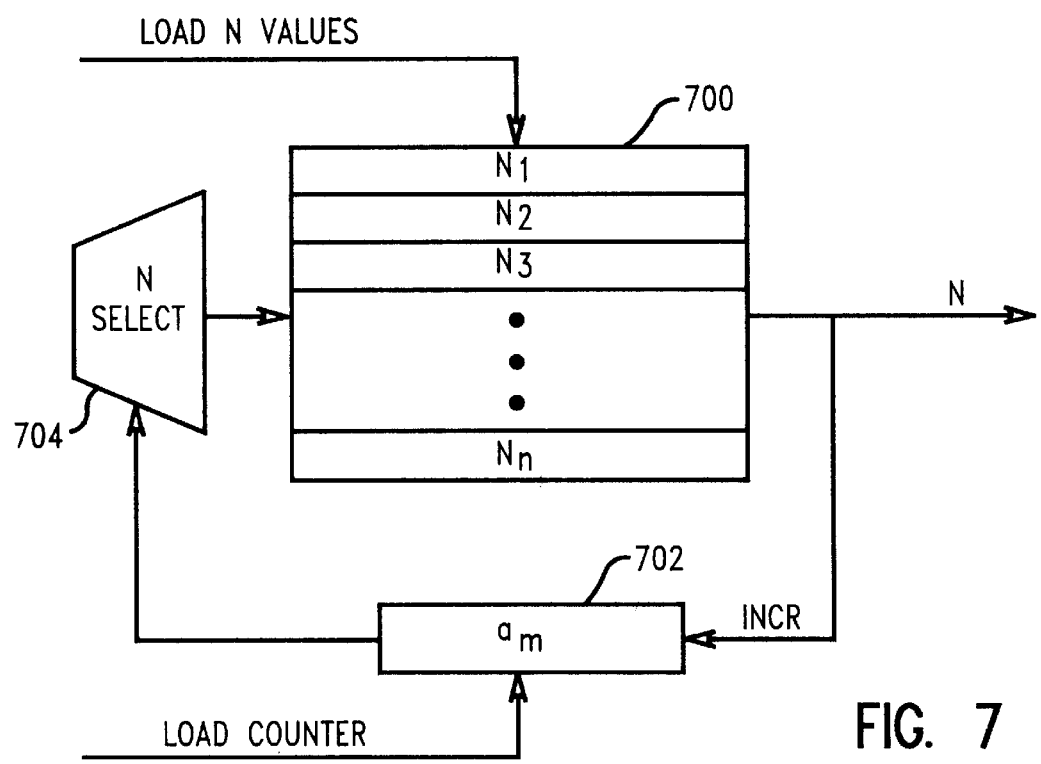
FIG. 7 is a block diagram of an exemplary hardware implementation of an adaptive divisor circuit for the voltage controlled oscillator of FIG. 2.

Turning now to FIGS. 6 and 7, block diagrams of the register layouts that vary the values of R and N over time, according to an exemplary embodiment of this invention, are shown. The exemplary embodiments of FIGS. 6 and 7 are for illustration purposes; the data structure and signal flow may be implemented in a number of known manners. In FIG. 6, there is a plurality of registers 600, one for each value in the progression of R values. Counter 602 is a counter and comparator. Counter 602 is loaded with an initial value. Every time an R value is output, a counter is incremented and compared to the initial value. If the two are equal, then counter sends a signal to R select 604. R select 604 selects which value of R is output for each cycle.

When a new frequency is required, processor (such as 22 of FIG. 1) sends data to the reference registers $R_1$ through $R_n$ and to the counter register $a_r$. To implement the example from above, there are five R registers. R registers 600 are loaded with 17, 33, 49, 65 and 81. The R counter register 602 is loaded with 20.

After the data is loaded and latched into all registers, the R divisor begins to count down by its contents (17 in the exemplary case) unit it reaches zero. A reset pulse is generated and counter 602 is incremented. The R divisor begins to count down again and when it reaches zero, a reset pulse is generated and counter 602 is incremented. This processing continues until the R counter 602 equals the loaded value. When the loaded value is reached, a reset pulse is produced by the R counter to enable the R select device 604 to switch to the next R register value 600 (33). Processing starts over until the steady state value (81) of R is reached.

In FIG. 7, there are a plurality of N registers 700, one for each value in the progression of N values. Counter 702 comprises a counter and comparator. Counter 702 is loaded with an initial value. Every time an N value is output, a counter is incremented and compared to the initial value. If the two are equal, then counter sends a signal to N select 704. N select 704 selects which value of N is output for each cycle.

The processor sends data to the main registers $N_1$ through $N_n$ and to the counter register $a_m$. 300 and five N registers 302 The N registers 302 are loaded with 864, 1648, is 2432, 3216 and 4000. The N counter register 306 is loaded with 20. After loading, the N divider counts down by its contents (864 for the first iteration) until it reaches zero. A reset pulse is produced and the M counter 306 is incremented. The M counter then resets and counts continuously until M counter 306 equals its loaded value (20 in this example).

When the counter equals its loaded value, a reset pulse is generated by the M counter to enable the N select device 310 to switch to the next N register 302 value. The process starts over again until the steady state value of N is reached. When both the steady state values of R and N are reached, the frequency is in its steady state value.

Figure 8:
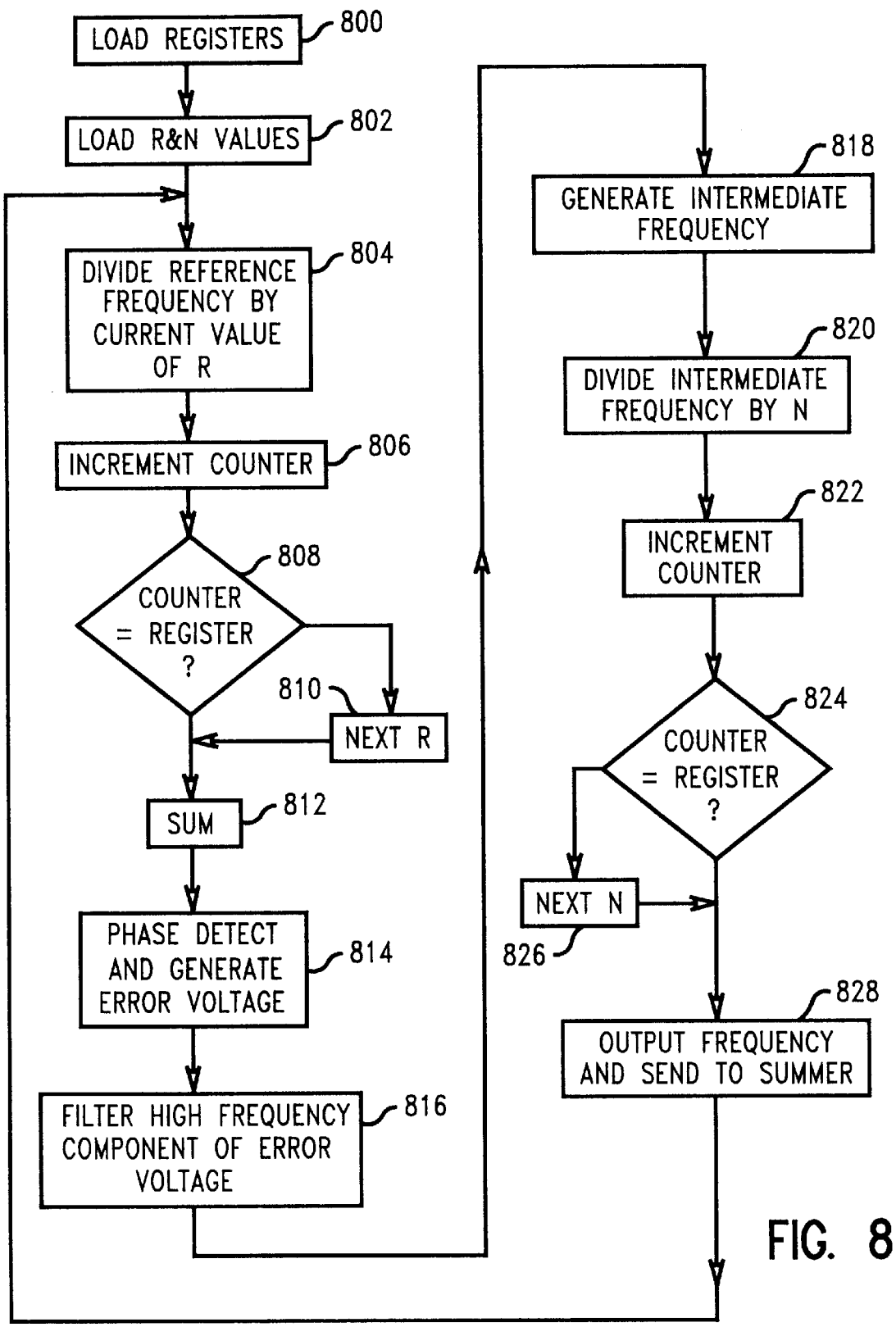
FIG. 8 is a flow chart of operation of the circuits of FIGS. 2, 6 and 7.

Turning to FIG. 8, processing according to a method of this invention is shown. Processing starts in box 800, where the processor loads the registers 600 and 700 and counters 602 and 702. Processing continues to action box 802 where the current value of the R divisor is loaded into reference frequency divider 220 (FIG. 2), and the current value of the N divisor is loaded into VCO 232. In action box 804, the reference frequency is divided by the current value of R. Processing continues to action box 806, where a counter is incremented and then processing proceeds to decision diamond 808. In decision diamond 808, a determination is made whether the incremented counter equals the number of iterations loaded into the R counter 602. If they are equal, then the reference frequency has been divided by the current value of R for the predetermined period of time. Processing proceeds to action box 810, where the next value of R is selected from register 600.

Processing continues from both decision diamond 808 and action box 810 to action box 812, where the input frequency (the reference frequency divided by R) is summed with the output frequency. Processing moves to action box 814, where the phase difference is determined (in phase detector 224 of FIG. 2) and an error voltage generated. After this step, processing can, advantageously move to action box 816, where the high frequency component of the output voltage is filtered.

Moving to action box 818, an intermediate frequency is generated in VCO 232, and, in action box 820 the intermediate frequency is divided by N. Processing continues to action box 822 where the second counter is incremented and then, in decision diamond 824, the second counter is compared to the value loaded into counter 702. If the values are equal, then a new value of N is selected from N register 702 (action box 826).

Processing continues from both decision diamond 824 and action box 826 to action box 828, where the resultant frequency is delivered as output and delivered back to the summer 222 (FIG. 2). Processing returns to action box 804.

It is to be understood that the above-described embodiment is an illustration of my invention and that many variations may be devised by those skilled in the art without departing from the scope of this invention. Therefore, this invention is limited only by the following claims.

What is claimed is:

1. A phase lock loop circuit comprising:
   an adaptive divider generating a progression of input frequencies from a reference frequency until a predetermined input frequency is reached;
   a summer summing said input frequency and an output frequency to generate an error frequency;
   a comparator generating a control voltage responsive to said error frequency; and
   a voltage controlled oscillator generating said output frequency responsive to said control voltage.

2. A phase lock loop circuit according to claim 1 wherein said adaptive divider increases a divisor of said reference frequency until a predetermined divisor is reached.

3. A phase lock loop circuit according to claim 1 wherein said voltage controlled oscillator generates an intermediary frequency responsive to said control voltage and adaptively dividing said intermediary frequency to generate said output frequency.

4. A phase lock loop circuit according to claim 3 wherein said adaptive divider increases a first divisor of said reference frequency until a first predetermined divisor is reached, said voltage controlled oscillator increases a second divisor of said intermediary frequency until a second predetermined divisor is reached and said first divisor and said second divisor change substantially simultaneously.

5. A phase lock loop circuit according to claim 1 wherein said adaptive divider increases its divisor over a predetermined time period.

6. A phase lock loop circuit according to claim 3 wherein said voltage controlled oscillator increases its divisor over a predetermined time period.

7. A phase lock loop circuit comprising:
   a summer summing an input frequency and an output frequency to generate an error frequency;
   a comparator generating a control voltage responsive to said error frequency; and
   a voltage controlled oscillator generating an intermediate frequency responsive to said control voltage, said voltage controlled oscillator adaptively dividing said intermediate frequency in a predetermined progression for generating said output frequencies.

8. A phase lock loop circuit according to claim 7 wherein said voltage controlled oscillator increases a divisor of said intermediate frequency until a predetermined divisor is reached.

9. A phase lock loop circuit according to claim 7 further comprising an adaptive divider generating a progression of input frequencies from a reference frequency until a predetermined input frequency is reached.

10. A phase lock loop circuit according to claim 9 wherein said adaptive divider increases its divisor over a predetermined time period.

11. A phase lock loop circuit according to claim 7 further comprising a low pass filter connected between said comparator and said voltage controlled oscillator to remove a high-frequency term of said control voltage.

12. A method for achieving rapid transient performance in a phase lock loop circuit, said method comprising the steps of:
    adaptively conditioning an input frequency by generating a progression of frequencies from a reference frequency until a predetermined frequency is reached;
    summing said conditioned input frequency with an output frequency;
    generating a voltage from the difference between said input and said output frequencies;
    adaptively generating an output frequency based on said voltage.

13. A method in accordance with claim 12 wherein said step of adaptively conditioning an input frequency comprises changing said frequency a plurality of times.

14. A method in accordance with claim 12 wherein said step of adaptively generating said output frequency comprises decreasing said output frequency over a predetermined period of time.

15. A method in accordance with claim 12 wherein said step of adaptively generating said output frequency comprises changing said frequency a plurality of times.

16. A method in accordance with claim 12 wherein said step of adaptively generating said output frequency comprises decreasing said output frequency over a predetermined period of time.

17. A control system that achieves fast transient times in a phase lock loop circuit, said phase lock loop circuit comprising a reference frequency division circuit, a summing circuit, a phase difference comparator and a voltage controlled oscillator for generating an output frequency including means for dividing said output frequency, said control system comprising:
    means for progressively changing a divisor in said division circuit dependent on a desired output frequency; and
    means for progressively changing a divisor in said voltage controlled oscillator dependent on the desired output frequency, wherein said divisor in said division circuit and said divisor in said voltage controlled oscillator vary until predetermined divisors are reached.

* * * * *